United States Patent [19]
Dickey

[11] Patent Number: 6,070,656
[45] Date of Patent: Jun. 6, 2000

[54] MICROELECTRONIC SUBSTRATE ACTIVE THERMAL COOLING WICK

[75] Inventor: James Todd Dickey, El Segundo, Calif.

[73] Assignee: The Aerospace Corporation, El Segundo, Calif.

[21] Appl. No.: 09/208,056

[22] Filed: Dec. 9, 1998

[51] Int. Cl.[7] .................................................. F28D 17/04
[52] U.S. Cl. ........................................ 165/114.26; 165/86
[58] Field of Search ............................... 165/104.26, 86; 126/45, 96

[56] References Cited

U.S. PATENT DOCUMENTS

| | | | |
|---|---|---|---|
| 3,307,783 | 3/1967 | Wiebelt | 165/96 |
| 5,659,285 | 8/1997 | Takeda | 337/389 |
| 5,769,154 | 6/1998 | Adkins | 165/104.26 |

FOREIGN PATENT DOCUMENTS

0953423 A  8/1982  U.S.S.R. ............................ 165/104.26

OTHER PUBLICATIONS

Carbone et al., Metallic wick for a heat pipe, IBM Technical Disclosure Bulletin, vol. 13 No. 9, pp.1–2.

*Primary Examiner*—Ira S. Lazarus
*Assistant Examiner*—Tho Duong
*Attorney, Agent, or Firm*—Derrick Michael Reid

[57] ABSTRACT

A dynamic microelectronic cooling wick is displaced from and juxtaposed to a heated substrate for creating a capillary wick providing dynamic capillary pumping action of a cooling fluid for temperature regulation of the substrate. The wick consists of at least two materials having different coefficients of thermal expansion so that the wick flexes in the presence of changing temperature to thereby change the effective radius of the capillary wick to transport the fluid to a substrate hot spot.

6 Claims, 3 Drawing Sheets

VERTICAL FLEXING WICK

SUBSTRATE VIEW

VERTICAL FLEXING WICK

HORIZONTAL FLEXING WICK

MICROELECTRONIC SUBSTRATE ACTIVE THERMAL COOLING WICK

BACKGROUND OF THE INVENTION

High powered electronic equipment is pushing the frontiers of thermal control technology. In the past, simply blowing air over components has been sufficient to maintain the device temperatures within specified thermal limits. Some applications have used liquid coolant to remove excess heat to a heat sink. Further, thermal radiators, extending from the microelectronic substrates, have been used to improve the thermal cooling efficiency. With the ever increasing speed and decreased size of electronics, simple convective cooling techniques, such as fans, may no longer serve to cool high heat flux components. Microelectronic chips used in home computers currently produce a heat flux on the order of 30 $W/cm^2$, these levels are expected to increase to 100 $W/cm^2$ in the very near future.

Circuitry typically fails by a single component subject to temperatures exceeding maximum limits. The reduction in excessive heat extends the life of microelectronic components. It has been estimated that for every 10C drop in hot spot temperature heat exposure, the life of the chip circuitry doubles. Also cracking due to thermal expansion and contraction is a common failure mode. Microcooling devices are employed to distribute the thermal energy uniformly, to reduce hot spot, and limit the amount of thermal expansion and contraction.

One such cooling device is a microthermal cooling heat pipe. An example of a microheat pipe may be found in U.S. Pat. No. 5,309,457, issued May 3, 1994; and Camarda, 5,598,632 issued Feb. 4, 1997. Microthermal cooling heat pipes utilize static wick structures to distribute thermal energy across a substrate. Structurally, the device is a closed vessel, or pipe, of various geometric cross sections with a capillary wick for transporting a working fluid. The wick may be narrow grooves machined into the pipe wall. At one end, the evaporator, heat is added at some temperature, vaporizing the liquid fluid from the wick material. The vaporized fluid flows along the central core of the pipe to a cooler, lower pressure end, known as the condenser. At the condenser end, the vapor is condensed to a liquid with the release of associated latent heat. The condensed liquid is pumped back to the evaporator section by the action of surface tension in the capillary structure of the wick material. The radius of the bottom of the narrow grooves of the capillary wick creates a pumping action as vapor collects at the condenser using incremental pressure gradient along the grooves. Microheat pipes use surface tension to create the pumping action for moving the fluid from a hot spot evaporator to a cold spot condenser in a rigid wick structure. The structure of the heat pipe, requiring tubular pipe formation, is difficult to manufacture in microelectronic and micro-electro-mechanical systems (MEMS). The grooved capillary wicks used in heat pipes have a predetermined bottom radius that limits the effective pumping action. Prior wicks have limited utility in the face of highly variable thermal exposures. These and other disadvantages are solved or reduced using the invention.

SUMMARY OF THE INVENTION

An object of the invention is to provide a dynamic thermal wick structure.

Another object of the invention is to provide a thermal cooling micro-electro-mechanical system (MEMS).

Another object of the invention is to provide a thermal cooling MEMS structure having a temperature dependent capillary pumping.

A new wick design utilizes MEMS technology to produce an active wick structure. By modifying the effective radius of the wick material, higher capillary pressure may be generated to transport liquid to hot spot areas where the liquid may be evaporated, thereby cooling the surroundings more efficiently. Additional effects may be to disperse liquid over a larger area. Increasing the predominate area over which phase change takes place, increases the thermal cooling efficiency. The wick is manufactured in the form of a MEM cantilever comprising of two different materials. By using at least two dissimilar materials with different coefficients of thermal expansion, the wick flexes in response to changing temperatures. The wick preferably flexes up and down to change the effective transport radius to increase or decrease the effective pumping pressure. Various flex shapes could result using multiple layers of various materials to provide a variation in the effective radius of the wick and the area covered by the liquid. These and other advantages are solved or reduced using the present invention.

DETAILED DESCRIPTION OF THE PREFERRED EMBODIMENT

Figure 1:
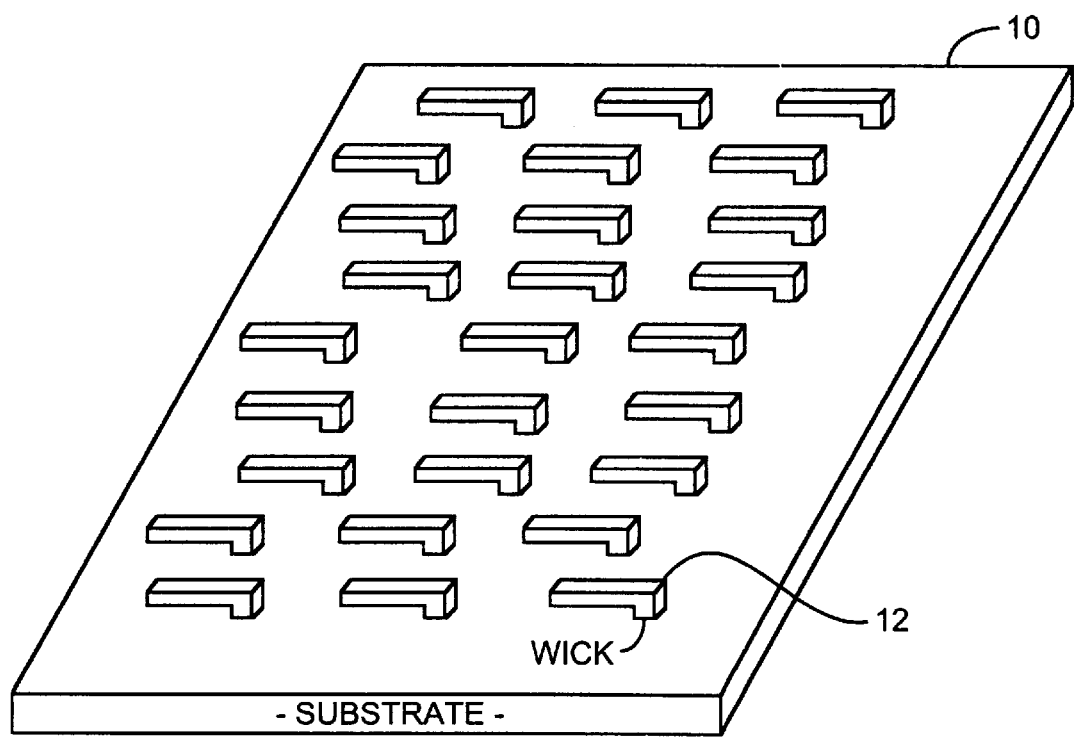
FIG. 1 is a drawing of a substrate supporting a plurality of active thermal cooling wicks.

An embodiment of the invention is described with reference to the figures using reference nomenclatures as shown in the figures. Referring to FIG. 1, substrate 10 is used to support one or more wick structures 12. The substrate 10 is preferably a microelectronic substrate or a micro-electro-mechanical system (MEMS) substrate. The wick 12 is placed on the substrate 10 to enhance thermal cooling. Various considerations may dictate placing various sized wicks 12 in various distributions about the substrate 10. For simplicity, an exemplar uniform distribution of vertically flexing wicks 12 is shown. The substrate supports fluid film typically delivered by a fluid system, not shown. The wick 12 function is to temperature regulate the substrate 10.

Figure 2:
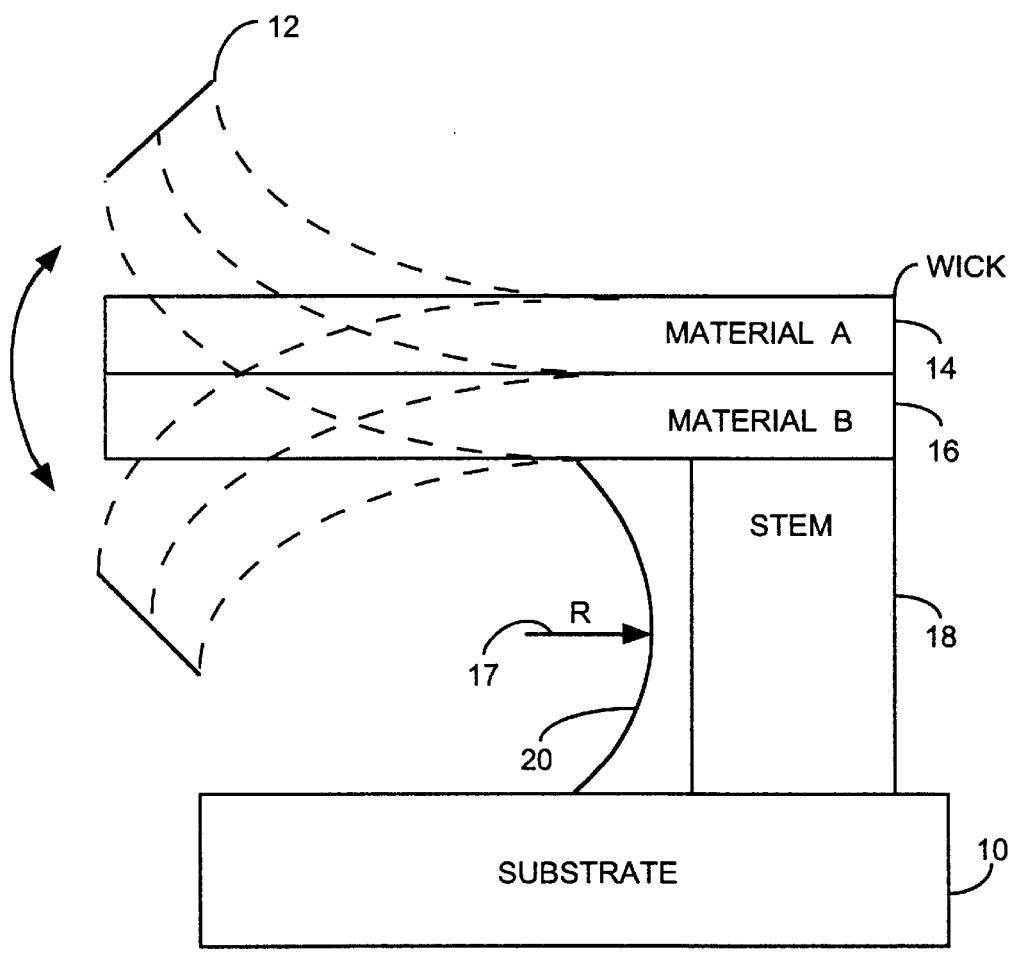
FIG. 2 is a drawing of a vertical flexing wick.

Referring to FIG. 2, a vertical flexing wick 12 is shown comprising a binary cantilever of material A 14 and material B 16. The wick 12 is separated from the substrate 10 by a stem 18 used to suspend the binary cantilever 14 and 16 from the substrate 10. The preferred design is the application of a rectangular MEMS geometry of a binary cantilever 14 and 16 creating a gap or separation defined by an R radius 17 extending in part between the surface of the substrate 10 and the wick 14. The cantilever 16 is suspended and or displaced from the substrate by a stem 18 to define the gap 17. The stem 18 may be composed of material B for ease of manufacture. The stem further conducts heat from the substrate 10 to the cantilever 14 and 16. The binary cantilever uses two materials 14 and 16 having different coefficient of expansion, causing the cantilever 14 and 16 to flex vertically up or down, depending on changes in substrate temperature, and as such, the radius of the fluid 20 of the gap 17 slightly increases or decreases, respectively. Hence, the gap 17 extends between the heated surface of the substrate 10 and cantilever 14 and 16, and varies based on the temperature to change the effective radius of the capillary wick defined by the gap 17. The capillary wick 12 also extends orthogonally to the plane of the flexing cantilever 14 and 16 along the depth of the wick 12. It should now be apparent that as the temperature of the substrate 10 changes, the radius of the gap 17 changes, causing corresponding change in the capillary pressure along the depth of the stem 18 to thereby change the pumping pressure, to preferably pump the fluid towards a hot spot and away from the cold spot. As the temperature of the substrate increases, the cantilever 14 and 16 flex down, the radius decreases, and the capillary wick pressure increases to pump the fluid towards the flexing point of the cantilever 14 and 16, to thereby pump fluid 20 for evaporation towards the flexing cantilever 14 and 16.

The cantilever 14 and 16 comprises at least two materials 14 and 16. An exemplar binary cantilever 14 and 16 consists of twenty microns of aluminum 14 having a coefficient of thermal expansion of 23.6×10E-6/K with a young's modulus of elasticity of 70 GPa, and one hundred microns of titanium 16 having a coefficient of thermal expansion of 9.5×10E-6/K with a young's modulus of elasticity of 114 GPa. The cantilever 14 and 16 may be 1.0 mm in depth and 10.0 mm in length from the stem 18. The stem 18 is 0.02 mm in height thereby suspending the cantilever 0.02 mm above the surface of the substrate 10. The preferred cantilever 14 and 16 will provide an increase of 3727349 N/m$_2$ (3727349 Pa) of capillary pressure, that corresponds to a 5.6% increase in liquid transport capability over a wick of like geometry and dimensions but without the advent of flexure. The preferred example uses two metals but metallic and non-metallic material could also be used. Other binary material may include gold and aluminum, silver and titanium, and copper and titanium, all of which are typical metallic materials commonly used in semiconductor and MEMS processes. The preferred liquid 20 is water, but other suitable fluids, such as ammonia or ethanol may be used as well.

Figure 3:
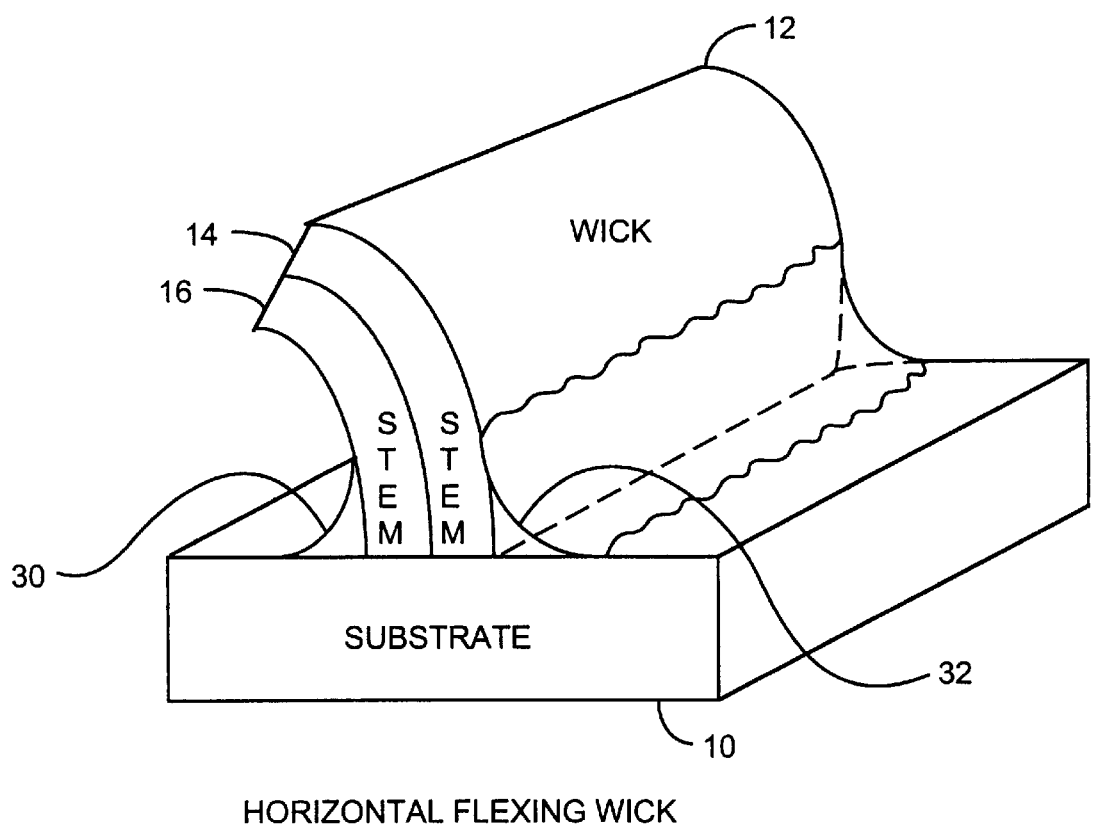
FIG. 3 is a drawing of a horizontal flexing wick.

Referring to FIG. 3, a horizontal flexing wick 12 is shown having a cantilever 14 and 16 extending vertically from the substrate 10. The cantilever 14 and 16 have a lower stem portion suspending an upper flexing portion. This configuration forms two right angle creases along the depth of the cantilever 14 and 16 for respectively supporting fluids 30 and 32. The stem portion couples thermal energy from the substrate 10 the cantilever 14 and 16. As the temperature of substrate changes, the cantilever 14 and 16 flexes back and forth, thereby changing the capillary radius and pumping the fluid 30 and 32 along the surface of the substrate for regulating temperature of the substrate 10.

Various wick configurations and wick capillaries design can be used, so long as the wick flexes to transport the fluid from one location on the substrate to a second location to respectively cool and heat the first and second locations of the substrate. It should now be apparent that modifying the geometry of the wick, in addition to various configurations, numbers and placements of materials, various coefficients of thermal expansion would result in additional permutations of the basic design. For example, the designs could entail a variety of structure shapes, geometries and material layering. The present invention is characterized by a thermal cooling wick having a temperature dependent radius defined by a wick structure having at least two different materials of mismatched coefficients of expansion to create a temperature dependent pumping action. Those skilled in the art can make enhancements, improvements and modifications to enhance the invention. However, those enhancements, improvements and modifications may nonetheless fall within the spirit and scope of the following claims.

What is claimed is:

1. A wick for transporting a fluid along a substrate for temperature regulation of a substrate, the wick comprising,
    a cantilever portion having at least two materials of unequal coefficients of thermal expansion, the cantilever flexing is a first direction when hot and in a second direction when cold,
    a stem portion for displacing the cantilever portion from the substrate and for defining a capillary wick supporting and transporting the fluid along in one direction when hot and another direction when cold along the substrate, the capillary wick is defined by a radius between the cantilever portion and the substrate to transport the fluid towards a hot spot and away from a cold spot on the substrate.

2. The wick of claim 1 wherein,
    the two materials are a member of the groups consisting of aluminum-titanium, aluminum-gold, sliver-titanium, and cooper-titanium.

3. The wick of claim 1 wherein
    the fluid is a member of the group consisting of water, ammonia or ethanol.

4. The wick of claim 1 wherein
    the radius expands to transport the fluid away from the low temperature portion of the substrate and contracts to transport the fluid towards the high temperature portion of the substrate.

5. The wick of claim 1 wherein,
    the stem also function to conduct thermal energy from the substrate to the cantilever portion.

6. The wick of claim 1 wherein the stem comprises at least one of the two materials.

* * * * *